United States Patent [19]

Himics et al.

[11] 4,045,318
[45] Aug. 30, 1977

[54] METHOD OF TRANSFERRING A SURFACE RELIEF PATTERN FROM A POLY(OLEFIN SULFONE) LAYER TO A METAL LAYER

[75] Inventors: Richard Joseph Himics, Skillman; Nitin Vithalbhai Desai, Edison; Eugene Samuel Poliniak, Willingboro, all of N.J.

[73] Assignee: RCA Corporation, New York, N.Y.

[21] Appl. No.: 710,184

[22] Filed: July 30, 1976

[51] Int. Cl.² .......................................... C23C 15/00
[52] U.S. Cl. ............................... 204/192 E; 96/35.1; 96/36; 96/36.2; 204/159.22; 427/43
[58] Field of Search ........ 204/192 E, 192 EC, 159.22; 427/43; 96/35.1, 36, 36.2

[56] References Cited

U.S. PATENT DOCUMENTS

| 3,733,258 | 5/1973 | Hanak et al. | 204/192 |
|---|---|---|---|
| 3,782,940 | 1/1974 | Ohto et al. | 96/36 |
| 3,860,783 | 1/1975 | Schmidt et al. | 219/121 EM |
| 3,875,026 | 4/1975 | Widmer | 204/27 |
| 3,884,696 | 5/1975 | Bowden et al. | 96/35 |
| 3,893,127 | 7/1975 | Kaplan et al. | 346/1 |
| 3,898,350 | 8/1975 | Gipstein et al. | 427/43 |
| 3,916,036 | 10/1975 | Gipstein et al. | 427/43 |
| 3,935,331 | 1/1976 | Poliniak et al. | 427/43 |
| 3,935,332 | 1/1976 | Poliniak et al. | 427/43 |
| 3,964,909 | 6/1976 | Himics et al. | 96/36.2 |

OTHER PUBLICATIONS

M. J. Bowden et al., "Poly(Styrene Sulfone)-A Sensitive Ion-Millable Positive Electron Beam Resist," *J. Electrochem. Soc.*, vol. 121, pp. 1620–1623 (1974).

M. J. Bowden et al., "Electron Irradiation of Poly(olefin sulfones), Application to Electron Beam Resists," *J. Appl. Polymer Sci.*, vol. 17, pp. 3211–3224 (1973).

L. F. Thompson et al., "A New Family of Positive Electron Beam Resists—" Poly(olefin sulfones)," *J. Electrochem. Soc.*, vol 120, pp. 1722–1726 (1973).

*Primary Examiner*—John H. Mack
*Assistant Examiner*—Aaron Weisstuch
*Attorney, Agent, or Firm*—H. Christoffersen; Birgit E. Morris; Joseph T. Harcarik

[57] ABSTRACT

This invention pertains to a method of transferring a surface relief pattern from a poly(olefin sulfone) layer to a metal layer wherein the poly(olefin sulfone) layer is exposed to ultra violet radiation prior to sputter etching the surface relief pattern into the metal layer.

7 Claims, 9 Drawing Figures

METHOD OF TRANSFERRING A SURFACE RELIEF PATTERN FROM A POLY(OLEFIN SULFONE) LAYER TO A METAL LAYER

CROSS REFERENCES TO RELATED APPLICATIONS

This application is related to copending applications entitled "Method of Transferring a Surface Relief Pattern from a Wet Poly(olefin sulfone) Layer to a Metal Layer" by E. S. Poliniak and N. V. Desai, Ser. No. 710,134, filed July 30, 1976 copending application "Method for Forming a Shallow Surface Relief Patter in a Poly(olefin sulfone) Layer" by E. S. Poliniak and N. V. Desai Ser. No. 710,135, filed July 30, 1976 and copending application "Method For Forming a Surface Relief Pattern in a Poly(olefin sulfone) Layer" by E. S. Poliniak and N. V. Desai Ser. No. 710,133, filed July 30, 1976, which applications are filed concurrently with this application and are herein incorporated by reference.

BACKGROUND OF THE INVENTION

Forming surface relief patterns on poly(olefin sulfone) polymer layers by electron beam resist methods are well known and are utilized for a variety of applications. For example, poly(1-methyl1-cyclopentene sulfone) has been used for audio/video recording applications and is more fully described in U.S. Pat. Nos. 3,935,331 and 3,935,332 by Poliniak et al.; poly(1-butene sulfone) has been employed for integrated circuit mask formation and poly(cyclopentene sulfone) and poly(bicycloheptene sulfone) have been employed for multilayer integrated circuit mask formation.

In general, the surface relief patterns that are formed in the poly(olefin sulfones) have not been found transferrable to a metal surface by use of sputter etching or ion milling operations wherein material is eroded from the relief pattern surface by ion bombardment. This is a disadvantage in many applications such as audio/video recording where a surface relief pattern which is recorded on a polymeric material must be subsequently transferred onto a metal surface which is employed as a master for stamping the surface relief pattern in large quantities of vinyl discs.

The sputter etching of poly(styrene sulfone) has been described by M. J. Bowden and L. G. Thompson, *Journal of the Electrochemical Society*, 121, 1620 (1974). This is a relatively insensitive poly(olefin sulfone), however, which does not form surface relief patterns with sharp edge definition. Other of the more sensitive poly(olefin sulfones), such as poly(1-methyl-1-cyclopentene sulfone), which do form the sharp edge definition required for such applications as audio/video recording, have previously not been found sputter etchable. These poly(olefin sulfones) are either highly reactive and initially degrade during a sputter etching cycle, with a corresponding distortion of the surface relief pattern, or they begin to crosslink and form a highly stable residual polymer which is extremely difficult to remove after the sputter etching cycle has been completed. It has been desired to transfer surface relief patterns from poly(olefin sulfone) layers to metal surfaces by sputter etching without the above mentioned disadvantages.

SUMMARY OF THE INVENTION

This invention pertains to a method of transferring a surface relief pattern from a poly(olefin sulfone) layer which comprises first exposing the developed poly(olefin sulfone) layer to ultra violet radiation and then bombarding the irradiated surface with sufficient ions to substantially remove the poly(olefin sulfone) layer and form the surface relief pattern in the metal layer. It has been found that exposing the poly(olefin sulfone) layer to ultra violet radiation before it is bombarded with ions will allow the sensitive, sharp edge forming poly(olefin sulfones) to udergo a sputter etching transfer to a metal layer without distortion of the surface relief pattern and without the formation of difficult-to-remove residual polymer.

DETAILED DESCRIPTION OF THE INVENTION

Poly(olefin sulfone) polymers useful for electron beam formation of surface relief patterns are copolymers of olefinically unsaturated hydrocarbons and $SO_2$. These polymers are known and are characterized by an $-SO_2-C-$ linkage. Suitable poly(olefin sulfone) polymers include poly(1-methyl-1-cyclopentene sulfone), poly(3-methyl-1-cyclopentene sulfone), poly(3-ethyl-1-cyclopentene sulfone), poly(2-methyl-1-pentene sulfone), poly(1-butene sulfone), poly(cyclopentene sulfone), poly(bicycloheptene sulfone) and poly(styrene sulfone). Poly(1-methyl-1-cyclopentene sulfone), poly(3-methyl-1-cyclopentene sulfone), and poly(3-ethyl-1-cyclopentene sulfone) are preferred polymers. The molecular weights of these polymers are generally from about 30,000 to about 3,000,000.

The poly(olefin sulfone) polymers are coated from solution onto a metal layer and formed into polymer layers about 0.3 to 1.0 micron thick by well known techniques such as spinning, brushing, dipping, and the like. The solvent may be removed by baking or vacuum drying the polymer. Surface relief patterns are formed in the poly(olefin sulfone) polymer layer by exposing the layer to a modulated beam of electrons and developing the layer with a solvent. Although the exact mechanism of recording is not known, it is believed the electron beam degrades the $-SO_2-C-$ linkage. This changes the solubility characteristic of the polymer so that, for positive acting polymers, contact with a solvent dissolves the exposed portions of the layer more rapidly than the unexposed portions.

Additional details for preparing poly(olefin sulfone) layers on metal layers and recording surface relief patterns thereon are described in U.S. Pat. No. 3,893,127 to Kaplan et al. and in U.S. Pat. Nos. 3,935,331 and 3,935,332 to Poliniak et al. which are incorporated herein by reference. The metal on whose surface the surface relief pattern will be transferred must have good adhesion to the poly(olefin sulfone) polymer layer, and must form well defined surface relief patterns upon ion bombardment. Suitable metals include gold, copper, aluminum, nickel and the like.

Figure 1:
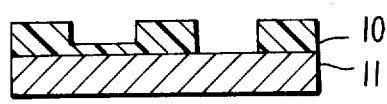
FIG. 1 is a cross sectional view of a developed poly(olefin sulfone) layer on a substrate.

FIG. 1 is a cross-sectional illustration of a surface relief pattern formed in a poly(olefin sulfone) layer 10 which is adhered to the surface of a metal layer 11. The surface relief pattern in the poly(olefin sulfone) layer 10 may be developed either partially or completely through to the surface of the metal layer 11. In another embodiment of this invention shown in FIG. 2, a surface relief pattern is formed in a poly(olefin sulfone) layer 15 which is adhered to the surface of a thin metal layer 16 which in turn is adhered to a substrate 17. The metal layer 16 is suitably about 200 to 10,000 angstroms thick and preferably is from 1,000 to 4,000 angstroms thick, and can be deposited on the substrate 17 by such standard techniques as vapor deposition, chemical plating, and the like. The substrate 17 must provide good adhesion with the metal layer 16 and can be of such standard materials as glass, polyester, another metal, and the like.

Figure 2:
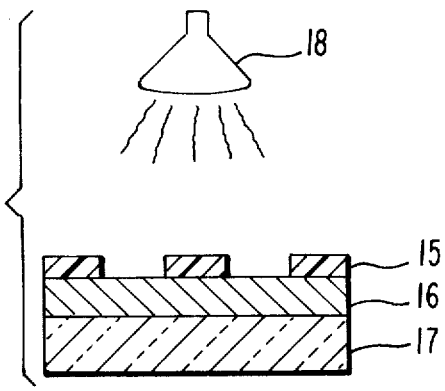
FIG. 2 is a schematic view of an apparatus for irradiating a developed poly(olefin sulfone) layer.

According to the present invention, the poly(olefin sulfone) layer having the surface relief pattern is exposed to ultra violet radiation before the surface relief pattern is transferred to the metal layer. FIG. 2 schematically illustrates an ultra violet lamp 18 which irradiates the poly(olefin sulfone) layer 15. It has been found that the most effective ultra violet wavelength spectrum is from about 1,700 to about 4,000 angstroms. The amount of ultra violet exposure needed to produce effective results will depend on the particular poly(olefin sulfone) employed and the thickness of the poly(olefin sulfone) layer. For example, when poly(1-methyl-1-cyclopentene sulfone) in layers 0.3 to 1 micron thick are employed, ultra violet exposure of about 150 to 3,000 millijoules/cm$^2$ and preferably about 1,800 millijoules/cm$^2$, will allow accurate transfer of the surface relief pattern without the formation of a difficult-to-remove residual polymer.

Figure 3:
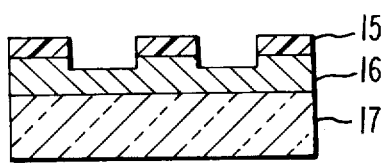
FIG. 3 is a cross sectional view of a developed poly(olefin sulfone) layer after sputter etching.
Figure 4:
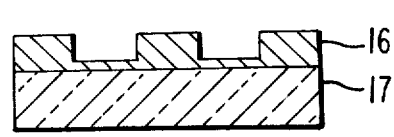
FIG. 4 is a cross sectional view of a sputter etched metal layer.

After ultra violet exposure, the surface relief pattern is bombarded with ions which causes the removal of material from the bombarded surface. As shown in FIG. 2, the surface relief pattern in the poly(olefin sulfone) layer 15 exposes certain portions and covers other portions of the metal layer 16. During ion bombardment, both the exposed metal layer 16 and the polymer layer 15 are eroded simultaneously. As shown in FIG. 3, a surface relief pattern forms in the metal layer 16 which corresponds to the surface relief pattern of the polymer layer 15. The bombardment is continued until the surface relief pattern formed in the metal layer 16 has approximately the same depth as the initial surface relief pattern in the poly(olefin sulfone) layer 15. After the bombardment has been completed, any residual polymer is removed by standard techniques, such as reactive sputter cleaning or chemical stripping with organic solvents or strong oxidizing agents such as Caro's acid, chromate/sulfuric acid and the like. FIG. 4 shows the surface relief pattern transferred to the metal layer 16 after removal of any residual resist.

Figure 5:
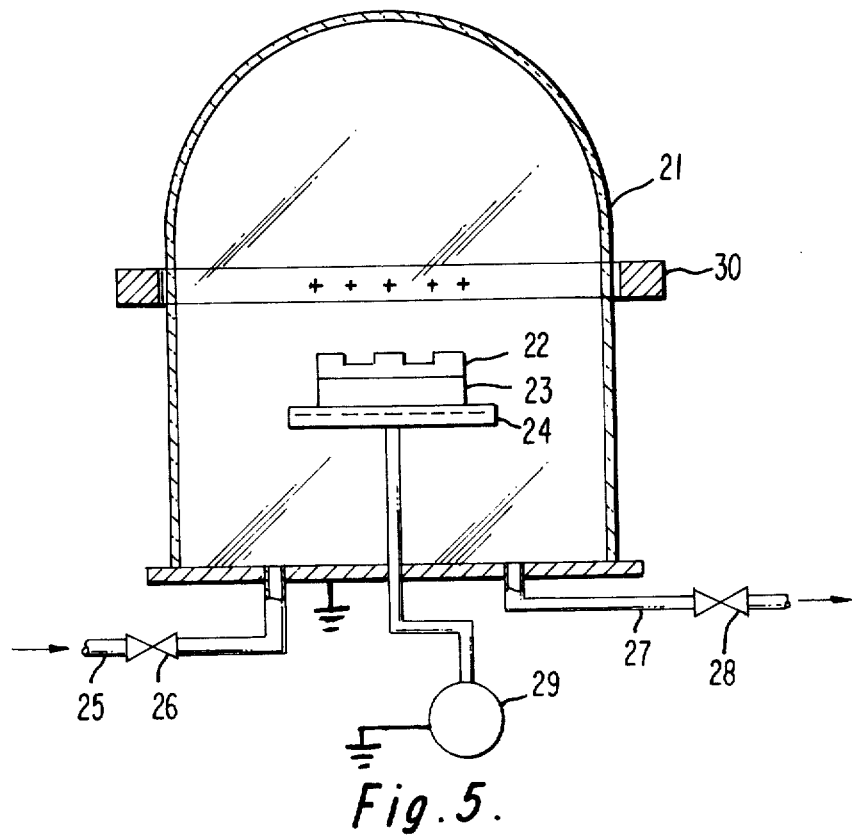
FIG. 5 is a schematic view of an ion bombarding apparatus.

A schematic diagram of an apparatus for sputter etching by ion bombardment is shown in FIG. 5. In a housing 21 is placed a poly(olefin sulfone) layer 22 and a metal layer 23 on a metal plate 24. A continuous flow of low pressure inert gas is maintained in the housing 21 which is introduced through a line 25 and a valve 26 and withdrawn through a line 27 and a valve 28. On the metal plate 24 is created a negative potential by means of a radio frequency generator 29. The negative potential on the plate 24 is maintained at sufficient magnitude to create a glow discharge primarily of positive ions in the inert gas above the plate 24. To steady the glow discharge, a magnetic field above the plate 24 is imposed by means of a magnetic coil 30. The positive ions in the glow discharge are forced by the negative potential of the plate 24 to spiral towards the plate 24 and strike the poly(olefin sulfone) layer 22 and the metal layer 23 causing erosion of the struck surface. The erosion is continued until the poly(olefin sulfone) layer 22 is substantially removed and until sufficient penetration of the surface relief pattern into the metal layer 23 has occurred. The glow discharge is then terminated and the metal layer 23 is removed from the housing 21.

The invention will be further illustrated by the following examples but it is to be understood that the invention is not meant to be limited to the details described therein.

EXAMPLE 1

A gold metal layer 2,000 angstroms thick was deposited on a 1.3 cm × 1.3 cm glass slide by vapor deposition.

A solution of 10 percent by weight of poly(1-methyl-1-cyclopentene sulfone) having an average molecular weight of 180,000 and 90 percent by weight of cyclopentanone solvent was spun on the metal layer with a spinning rate of 1,000 rpm. After a polymer solution layer had formed, the spinning was stopped and the solvent was removed by vacuum drying at 10$^{-6}$ torr for 18 hours. The resultant poly(1-methyl-1-cyclopentene sulfone) layer was 1 micron thick.

Utilizing a modulated scanning electron beam microscope at an intensity of 6.7 microcoulomb/cm$^2$, raster patterns having widths of about 1.5 microns were exposed. These raster patterns were developed with 2-methylcyclopentanone solvent to produce a surface relief pattern in the polymer layer.

The surface relief pattern, by means of a medium pressure ultra violet lamp, was exposed to ultra violet radiation (2,000 to 4,000 angstroms) of 30 millijoules/sec-cm$^2$ for 60 seconds (1800 millijoules/cm$^2$). Next, the surface relief pattern was sputter etched utilizing an apparatus as described in FIG. 5 under the following conditions:

| Inert gas | Argon |
| --- | --- |
| Inert gas pressure | 2.5 microns |
| Magnetic field | 20 gauss |
| R.F. sheath potential | 600 volts |
| Etching time | 5 minutes |

Figure 6:
FIG. 6 is a photomicrograph of a sputter etched metal layer according to the invention.

After sputter etching, the residual polymer was removed with a chromate/sulfuric acid mixture. It was found that a relief pattern was formed in the metal layer which corresponded to the original relief pattern in the poly(1-methyl-1-cyclopentene sulfone) layer. FIG. 6 is a photomicrograph of the metal layer after sputter etching, illustrating the excellent quality of the transferred surface relief pattern.

EXAMPLE 2

Figure 7:
FIG. 7 is a photomicrograph of a sputter etched metal layer control.

This example is presented as a control. A surface relief pattern was formed on a poly(1-methyl-1-cyclopentene sulfone) layer as described in EXAMPLE 1. This sample, however, was not exposed to ultra violet radiation prior to sputter etching. The material was sputter etched under the same conditions as in EXAMPLE 1. (FIG. 7 is a photomicrograph of the metal layer after sputter etching). It was found that sputter etching degraded the poly(1-methyl-1-cyclopentene sulfone) layer and the transfer of the surface relief pattern to the metal layer was highly pitted and distorted.

EXAMPLE 3

Figure 8:
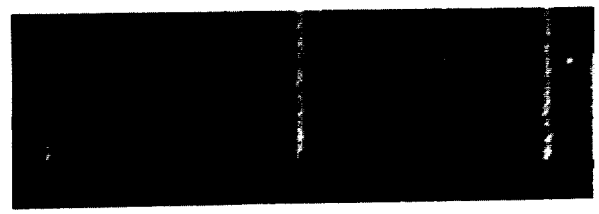
FIG. 8 is a photomicrograph of another sputter etched metal layer of the invention.

In this example a surface relief pattern was sputter etched into a metal substrate utilizing a UV exposure as in EXAMPLE 1, except that poly(3-methyl-1-cyclopentene sulfone) having a molecular weight of 2,000,000 was employed as the poly(olefin sulfone) layer, and the scan speed was 25 cm/sec. (2.6 microcoulomb/cm$^2$ exposure). The developer was a mixture of 50 percent by weight of 2-methylcyclohexanone and 50 percent by weight of 2-methylcyclohexanol, and the poly(olefin sulfone) layer was not vacuum dried prior to the electron beam exposures. After the surface relief pattern had been sputter etched, residual polymer was easily removed using methyl pyrrolidone as a solvent. This exposed a sharply defined surface relief pattern in the metal surface as is shown in the photomicrograph of FIG. 8.

EXAMPLE 4

Figure 9:
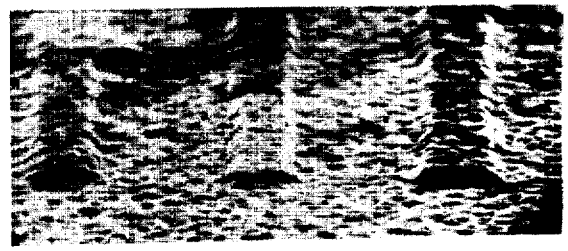
FIG. 9 is a photomicrograph of another sputter etched metal layer control.

This example is presented as a control. A surface relief pattern on a metal layer was formed as in EXAMPLE 3 except that the poly(3-methyl-1-cyclopentene sulfone) was not UV exposed prior to sputter etching and the scan speed was 10 cm/sec. (6.7 microcoulomb/cm$^2$ exposure). The residual polymer that formed during sputter etching could not be removed by soaking with chromate/sulfuric acid solution overnight. Thus the surface relief pattern in the metal layer was pitted and not completely free of residual polymer, as shown in the photomicrograph of FIG. 9.

What is claimed is:

1. A method of transferring a surface relief pattern formed in a poly(olefin sulfone) layer to a metal layer in contact with said poly(olefin sulfone) layer which comprises exposing said poly(olefin sulfone) layer to ultra violet radiation and bombarding the irradiated surface with sufficient ions to substantially remove the poly(olefin sulfone) layer thereby forming the surface relief pattern in the metal layer.

2. A method according to claim 1 wherein the poly(olefin sulfone) is selected from the group consisting of poly(1-methyl-1-cyclopentene sulfone), poly(3-methyl-1-cyclopentene sulfone), and poly(3-ethyl-1-cyclopentene sulfone).

3. A method according to claim 1 wherein the poly(olefin sulfone) layer is from about 0.3 to about 1.0 micron thick.

4. A method according to claim 1 wherein the metal layer is selected from the group consisting of gold, copper, aluminum, and nickel.

5. A method according to claim 1 wherein the ultra violet wavelength spectrum is from about 1,700 to 4,000 angstroms.

6. A method according to claim 1 wherein the ultra violet exposure is from about 150 to 3,000 millijoules/cm$^2$.

7. A method for forming a surface relief pattern in a metal layer which comprises:
   a. exposing a poly(olefin sulfone) layer in contact with the metal layer to a modulated beam of electrons;
   b. developing the exposed poly(olefin sulfone) layer to form a surface relief pattern therein;
   c. exposing the developed poly(olefin sulfone) layer to ultra violet radiation; and
   d. bombarding the irradiated surface with sufficient ions to substantially remove the poly(olefin sulfone) layer and etch the surface relief pattern into the metal layer.

* * * * *